United States Patent
Oliver et al.

(10) Patent No.: US 7,095,099 B2
(45) Date of Patent: Aug. 22, 2006

(54) LOW PROFILE PACKAGE HAVING MULTIPLE DIE

(75) Inventors: Stephen Oliver, Redondo Beach, CA (US); Marco Soldano, El Segundo, CA (US); Mark Pavier, West Sussex (GB); Glyn Connah, Glossop (GB); Ajit Dubhashi, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/988,443

(22) Filed: Nov. 12, 2004

(65) Prior Publication Data

US 2005/0151236 A1 Jul. 14, 2005

Related U.S. Application Data

(60) Provisional application No. 60/590,285, filed on Jul. 21, 2004, provisional application No. 60/519,592, filed on Nov. 13, 2003, provisional application No. 60/519,503, filed on Nov. 12, 2003.

(51) Int. Cl.
*H01L 23/495* (2006.01)

(52) U.S. Cl. .................. 257/676; 257/666; 257/674; 257/E23.043

(58) Field of Classification Search ........... 257/674, 257/676, 735, 666, E23.014, E23.02, E23.031, 257/E23.037, E23.039, E23.043
See application file for complete search history.

(56) References Cited

U.S. PATENT DOCUMENTS

| | | | | |
|---|---|---|---|---|
| 6,144,093 | A * | 11/2000 | Davis et al. | 257/723 |
| 6,184,585 | B1 * | 2/2001 | Martinez et al. | 257/777 |
| 2003/0057530 | A1 * | 3/2003 | Karrer | 257/666 |
| 2004/0004272 | A1 * | 1/2004 | Luo et al. | 257/666 |
| 2005/0224945 | A1 * | 10/2005 | Saito et al. | 257/686 |

* cited by examiner

*Primary Examiner*—Minhloan Tran
*Assistant Examiner*—Leslie Pilar Cruz
(74) *Attorney, Agent, or Firm*—Ostrolenk, Faber, Gerb & Soffen, LLP

(57) ABSTRACT

A low profile semiconductor device package includes a lead frame with terminal leads and two die pads for receiving at least two semiconductor die that are interconnected to form a circuit. A further low profile semiconductor device package includes a lead frame with two die pads for receiving at least two semiconductor die that are interconnected to form a circuit and also has a reduced height through removal of a mounting tab. An example of such device packages is a package that includes first and second MOSFET die, each connected to a respective die pad. The source of one MOSFET is connected to the drain of the other MOSFET, thereby forming a low profile device package that provides a half-bridge circuit. Other example device packages include different arrangements of two interconnected MOSFET die, two interconnected IGBTs, or a combination of a MOSFET die and a diode.

25 Claims, 7 Drawing Sheets

LOW PROFILE PACKAGE HAVING MULTIPLE DIE

RELATED APPLICATIONS

This application is based on and claims priority to U.S. Provisional Application No. 60/519,592, filed on Nov. 13, 2003, by Stephen Oliver and Marco Soldano, entitled, "Low Profile Package Having Multiple Die," to U.S. Provisional Application No. 60/519,503, filed on Nov. 12, 2003, by Stephen Oliver and Marco Soldano, entitled, "Improved Low Profile Package Design," and to U.S. Provisional Application No. 60/590,285, filed on Jul. 21, 2004, by Stephen Oliver and Marco Soldano, entitled, "Improved Low Profile Package Design," the contents of which are herein incorporated by reference.

BACKGROUND OF THE INVENTION

1. Field of the Invention

This invention relates to semiconductor device packages, and more specifically, relates to low profile semiconductor device packages with multiple die.

2. Discussion of the Related Art

Semiconductor device packages are used in many digital applications that provide improvements over prior art analog applications. For example, Class D audio amplifiers are smaller, lighter, cooler and quieter than analog audio amplifiers, and provide extended battery life compared to the power hungry analog devices. Class D amplifiers also provide improved switching speeds over Class AB linear amplifiers, and, accordingly reduce power loss and reduce sound distortions in sound output. Class D amplifiers can be implemented, for example, using multiple low profile semiconductor device packages, such as a TO-220 package.

In addition to Class D audio amplifiers, low profile semiconductor device packages, such as the TO-220 package, are also useful in a range of other applications. For example, low profile device packages are used in lighting circuit applications and are also used as switching devices in notebook computers.

Referring now to the Figures in which like reference numerals refer to like elements, there is shown in FIGS. 1A and 1B a front elevational view and a right elevational view of an example prior art, low profile, semiconductor device package 100, such as the TO-220 package. As shown in FIGS. 1A and 1B, package 100 includes a mounting hole section 130. This mounting hole section is provided and used to mount package 100 to, for example, a heat sink in a notebook computer adapter. As shown in FIG. 1A, package 100 further includes a lead frame 102 that includes a single die pad 104 for receiving at least one semiconductor die 106, preferably a MOSFET die, although other die forms, such as diodes, insulated gate bipolar transistors (IGBTs), or the like can be used. The lead frame also includes five terminal leads 110, 112, 114, 116, and 118 protruding from the lead frame and extending from one edge of the package beyond the periphery of an insulated housing 108 for external connection. Of course, one skilled in the art will recognize that lead frame 102 may include something other than five terminal leads, for example, three terminal leads.

Assuming semiconductor die 106 is a MOSFET die, as shown in FIG. 1A, terminal lead 114 is electrically connected to die pad 104 and in turn to the drain electrode of the MOSFET die. The source and gate electrodes of the die may be electrically connected by bond wires to one or more terminals, other than terminal lead 114. In this example, the source electrode is electrically connected to terminal leads 110, 112, and 116 by bond wires 120, 121, and 122 and the gate electrode is electrically connected to terminal lead 118 by bond wire 123. Of course, one skilled in the art will recognize that these terminal assignments can vary depending on the application.

It should also be noted that a full-height three-pin full-pak with a split lead frame used for common anode and series diode configurations is also known in the industry. For example, see device package 1300 in FIG. 13.

Referring now to the FIGS. 2A and 2B there is shown a front elevational view and a right elevational view of another example prior art, low profile, semiconductor device package 200. Package 200 is similar to device package 100, with a lead frame 202 that includes a single die pad and three or five terminal leads, for example, but has a reduced height, not including a mounting hole section 130. Device package 200 may be, for example, a short-height TO-262 package.

Overall, prior art semiconductor device packages, such as packages 100 and 200, are useful in many applications and provide several benefits in the industry. For example, the device packages are inexpensive and easy to fabricate. Furthermore, the packages are small, lightweight, and have low profiles thereby reducing the cost, size, and weight of high volume consumer applications. In addition, package 200 is useful for reduced height applications. However, it is observed that these prior art device packages are not always suitable for packaging circuits that require multiple die.

For example, referring to FIG. 3, there is shown a conventional half-bridge circuit 300, such as that used in a Class D amplifier. Circuit 300 comprises a high side N-Channel MOSFET 310 and a low side N-Channel MOSFET 320. Of course, one skilled in the art will recognize that MOSFETs 310 and 320 may also be of the P-Channel type. Each MOSFET provides a switching function under the control of a suitable control circuit 302 that is connected to gate 316 of MOSFET 310 and to gate 326 of MOSFET 320, the specific control circuit depending on the application. To complete the half-bridge circuit, source 314 of MOSFET 310 is connected to drain 322 of MOSFET 320. The half-bridge circuit interconnects to a specific circuit application through drain 312 of MOSFET 310 and source 324 of MOSFET 320.

In order to implement the half-bridge circuit of FIG. 3 using a low profile semiconductor device package, such as package 100 or package 200, two device packages are required, one package for a MOSFET die 310 and a second package for a MOSFET die 320. However, the use of multiple low profile device packages to implement circuits, such as this half-bridge circuit, increases part and assembly costs for end applications, creates the need for additional circuit board space, and also creates the need for larger heat sinks.

BRIEF SUMMARY OF THE INVENTION

Accordingly, it is desirable to provide low profile semiconductor device packages that have the benefits of prior art semiconductor device packages 100 and 200 but also provide for multiple semiconductor die, thereby overcoming the above and other disadvantages of the prior art. In particular, it is desirable to provide low profile semiconductor device packages that form circuits, such as a half-bridge circuit, and to provide these packages substantially as the low profile semiconductor device package 100 and as the reduced height, low profile semiconductor device package 200.

In accordance with a first example embodiment of the present invention, a low profile semiconductor device package includes a lead frame and terminal leads that are substantially similar to that of package 100. However, the lead frame, according to this example embodiment of the invention, now includes two distinct die pads for receiving at least two semiconductor die, contrary to the single die pad of package 100. As such, a low profile semiconductor device package according to this embodiment of the present invention provides for multiple, co-packaged, semiconductor die that can form a circuit.

It is noted that the device package according to this example embodiment of the present invention may take the form of a TO-220 package or of a FULL PAK type structure. The FULL PAK type structure is made by the International Rectifier Corporation and is a TO-220 package with full enclosing insulation. However, the package may also take the form of a surface mount TO-263 package (i.e., D2pak).

In accordance with a further example embodiment of the present invention, a low profile semiconductor device package includes a lead frame and terminal leads that are substantially similar to that of package 200. However, similar to above, the lead frame according to this example embodiment of the invention now includes two distinct die pads for receiving at least two semiconductor die. As such, this embodiment of the present invention provides for a reduced height, low profile semiconductor device package with multiple, co-packaged semiconductor die that can form a circuit.

It is noted that the device package according to this example embodiment of the present invention may take the form of a short height TO-262 package or of a FULL PAK type structure, with the conventional mounting tab removed.

An example low profile or reduced height, low profile semiconductor device package according to these embodiments of the present invention is a co-packaged half-bridge switching circuit. Here, the example package includes two MOSFET die and a lead frame with two die pads and five terminal leads, although the number of terminal leads is not specific to the invention. Three of the five terminal leads are isolated while two are electrically connected to a respective die pad. The drain electrodes of the two MOSFET die are electrically connected to a respective die pad. The source electrode and the gate electrode of the first MOSFET die and the gate electrode of the second MOSFET die are each connected to a respective one of the isolated terminal leads. Finally, the source electrode of the second MOSFET die is connected to the drain electrode of the first MOSFET die, thereby creating the example half-bridge circuit. Of course, one skilled in the art will recognize that other terminal lead arrangements are possible.

One skilled in the art will further recognize that packages according to the present invention need not be limited for use in a half-bridge configuration and that the semiconductor devices need not be limited to MOSFET die. The packages can also be used in other circuit configurations and can include different combinations of MOSFET die, IGBTs, and a MOSFET die and diode, for example.

In general, by co-packaging multiple semiconductor die to form a circuit, such as a half-bridge circuit, according to the present invention, the benefits of prior low profile and reduced height device packages are obtained while also reducing part and assembly costs for end applications and simplifying circuit board layouts. Furthermore, by substantially re-using the same lead frame and terminal leads of the prior art packages 100 and 200, significant changes are not required to manufacture the present invention, thereby preventing increased costs.

DETAILED DESCRIPTION OF THE INVENTION

Figure 1A:
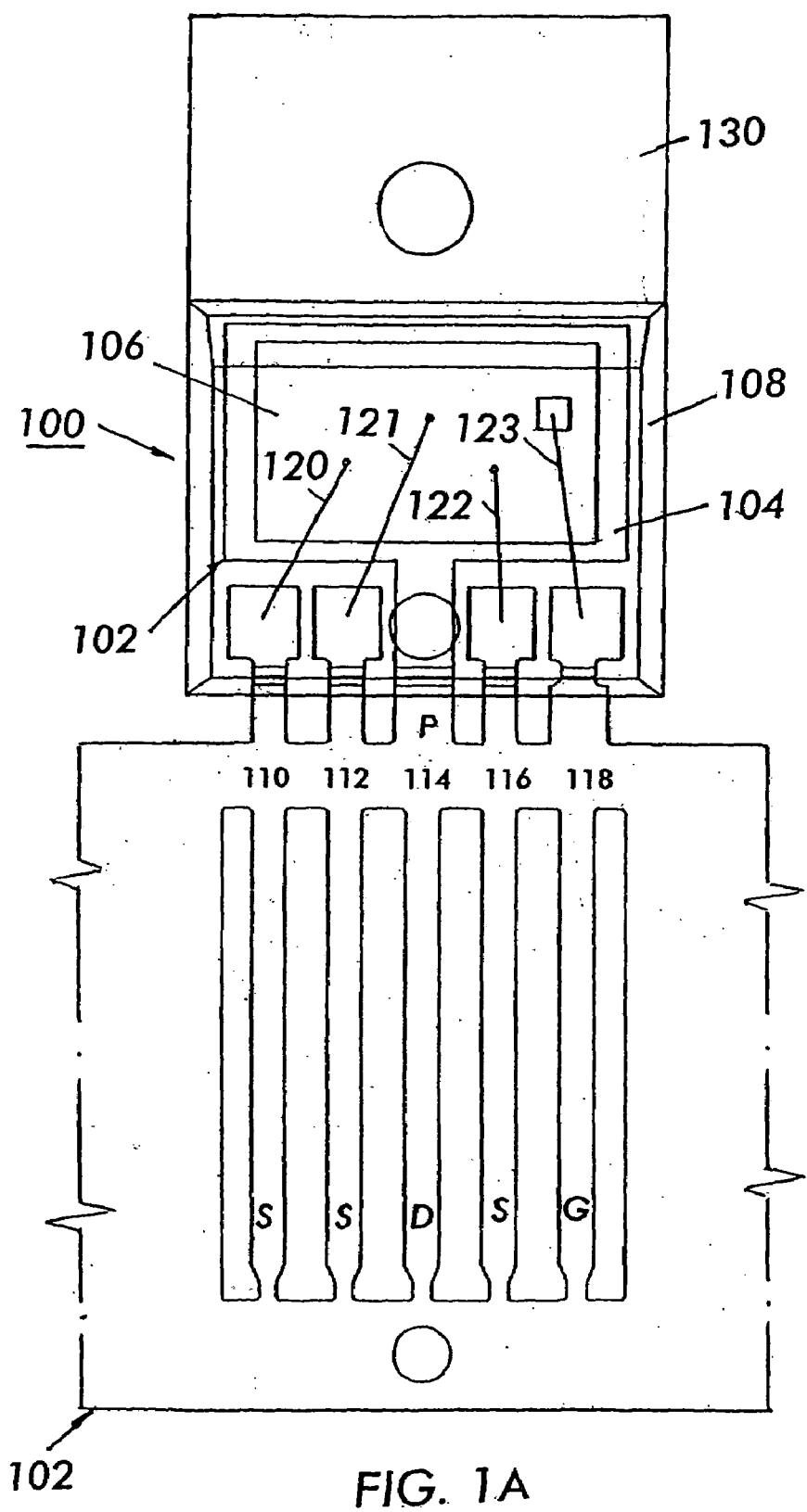
FIGS. 1A and 1B are schematic front elevational and right elevational views of an example low profile, prior art, semiconductor device package.
Figure 1B:
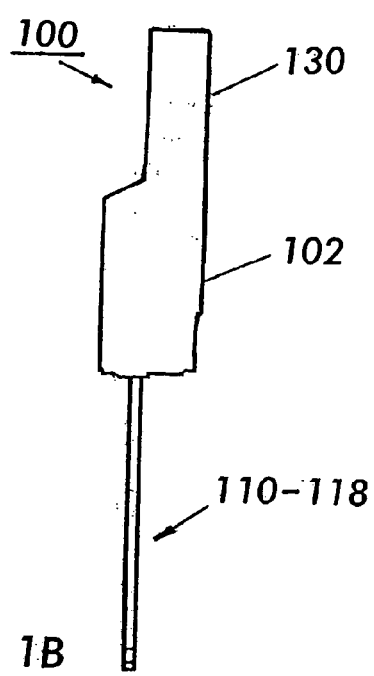
Figure 2B:
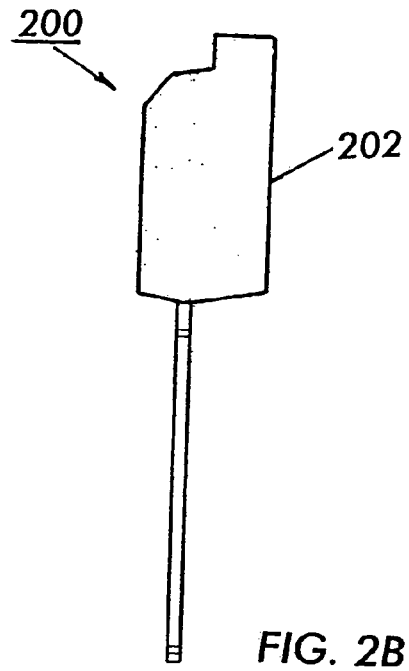
FIGS. 2A and 2B are schematic front elevational and right elevational views of an example low profile, reduced height, prior art, semiconductor device package.
Figure 3:
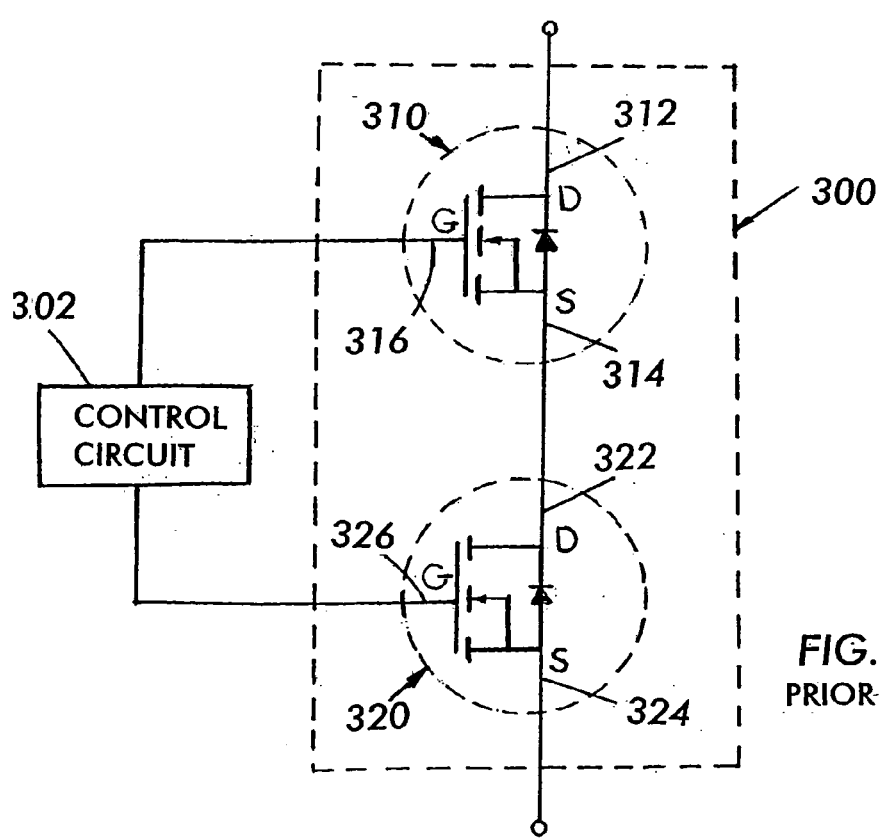
FIG. 3 is a circuit diagram of a known half bridge circuit arrangement using two N-Channel MOSFET die.
Figure 2A:
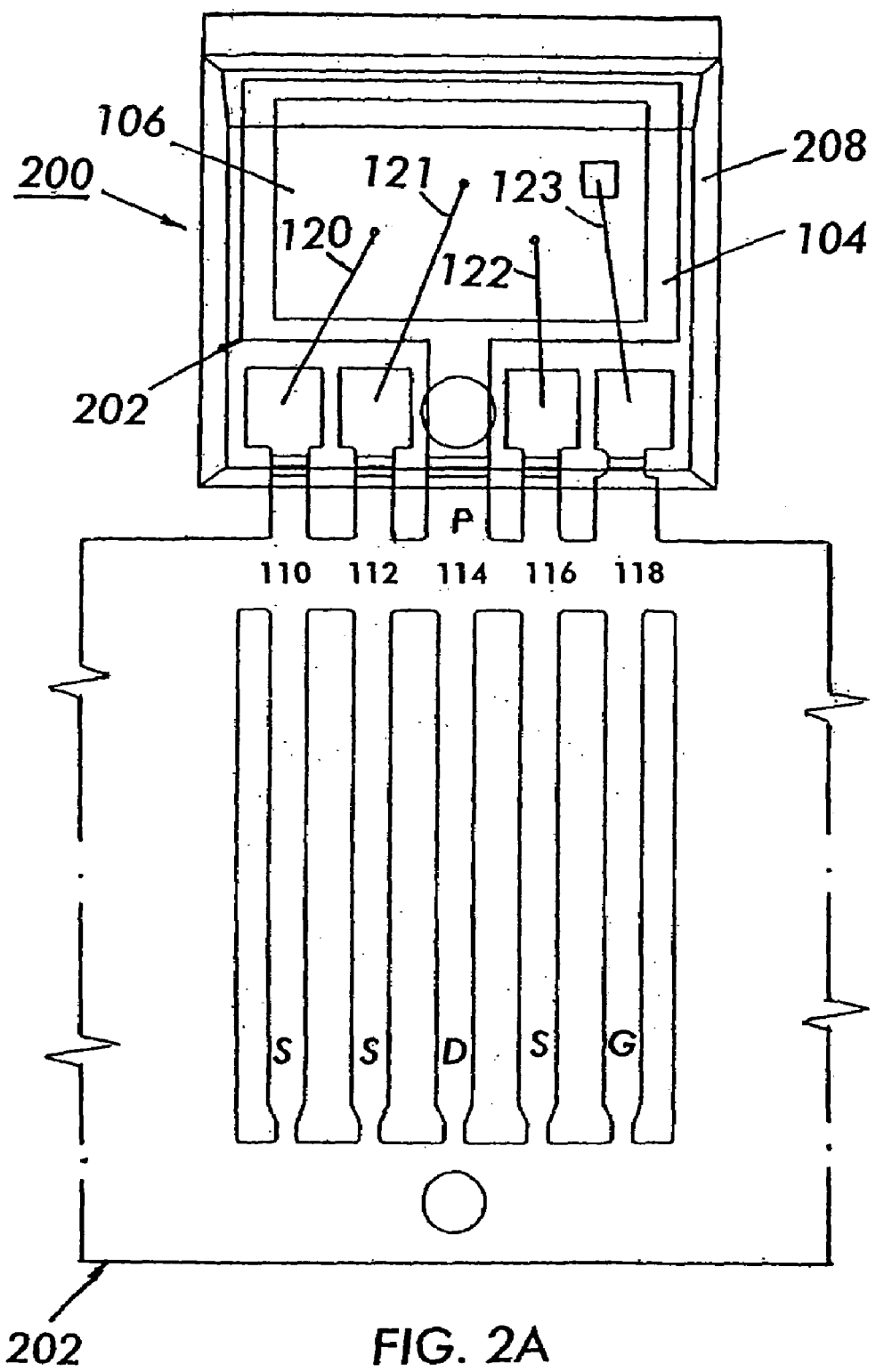
Figure 4:
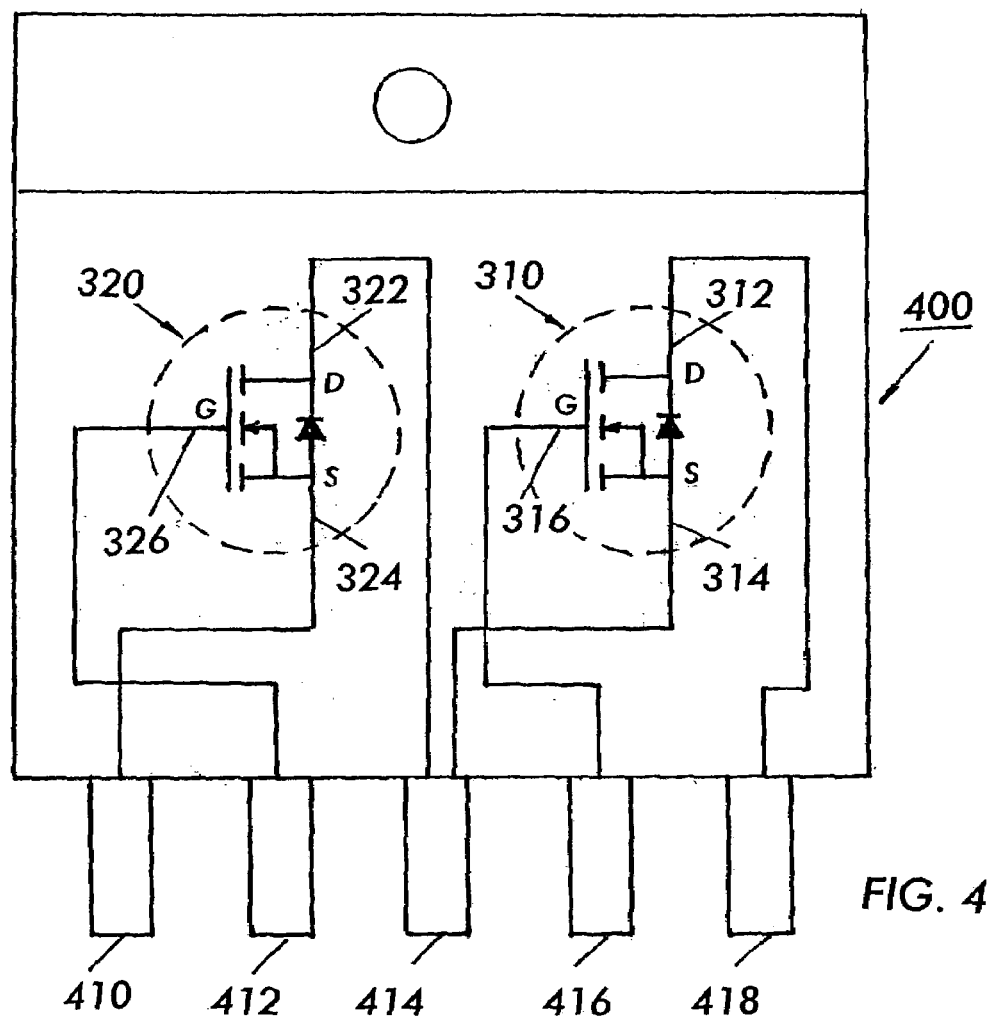
FIG. 4 schematically shows a half-bridge circuit in an example package according to an embodiment of the invention.
Figure 5:
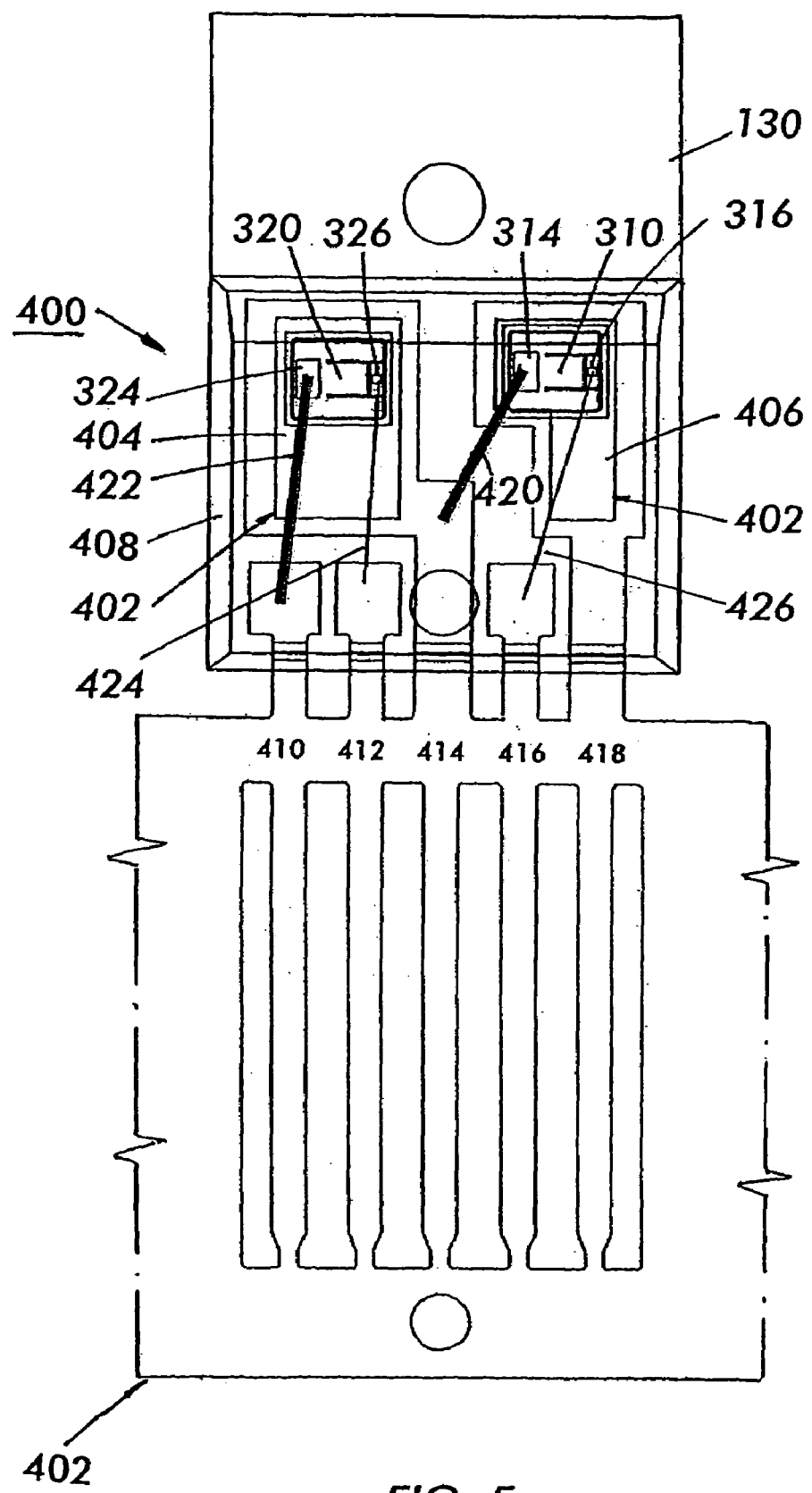
FIG. 5 illustrates an example semiconductor device package according to an embodiment of the present invention.

Referring now to FIGS. 4 and 5, an example semiconductor device package 400 in accordance with an example embodiment of the present invention is shown. Preferably, device package 400 is similar to device package 100 of the prior art and has a lead frame 402 and a number of lead terminals 410–418 that are substantially similar to those of package 100. However, the lead frame according to this embodiment of the invention now includes two distinct die pads 404 and 406 for receiving at least two semiconductor die, contrary to the single die pad of package 100. The semiconductor die can be MOSFET die, diodes, IGBTs, or the like or some combination thereof. As such, example package 400 according to this embodiment of the invention is a low profile semiconductor device package that provides for multiple semiconductor die that can form a circuit.

More specifically, referring to FIG. 4, the example package 400 according to this example embodiment of the invention includes five isolated terminal leads 410, 412, 414, 416, and 418 for external connection and includes MOSFET die 310 and MOSFET die 320. As seen, gate 316 of MOSFET die 310 is connected by wire bonds to isolated terminal lead 416. Drain 312 of MOSFET die 310 is connected to terminal lead 418. Source 324 and gate 326 of MOSFET die 320 are connected by wire bonds to isolated terminal leads 410 and 412, respectively. Source 314 of MOSFET die 310 and drain 322 of MOSFET die 320 are interconnected to one another and to terminal lead 414, thereby creating an example half-bridge circuit. Hence, in accordance with this example embodiment of the present invention, the low profile semiconductor package 100 of the prior art now provides at least two co-packaged die that can be interconnected as a circuit. In this example, MOSFET die 310 and MOSFET die 320 are co-packaged and interconnected to form a half-bride circuit.

Referring now to FIG. 5, example package 400 according to this embodiment of the invention is shown in further detail and includes a lead frame 402 that includes two separate die pads, 404 and 406, for receiving multiple semiconductor die. In this example, die pad 404 receives MOSFET die 320 and die pad 406 receives MOSFET die 310. Specifically, drain 322 of MOSFET die 320 is electrically connected by solder, conductive epoxy, or the like, to conductive pad 404 and drain 312 of MOSFET die 310 is electrically connected by solder, conductive epoxy, or the like, to conductive die pad 406.

Lead frame 402 also includes terminal leads 414 and 418. Terminal lead 414 is electrically connected to, and may be integral with, die pad 404 and extends from die pad 404 beyond the periphery of insulated housing 408. Terminal lead 418 is electrically connected to, and may be integral with, die pad 406 and extends from die pad 406 beyond the periphery of insulated housing 408.

Lead frame 402 further includes isolated terminal leads 410, 412, and 416, each with respective bond pad extensions that are within insulated housing 408. Each of terminal leads 410, 412, and 416 also extends beyond the periphery of insulated housing 408. As shown in this example package, the terminal leads 410, 412, 414, 416, and 418 are parallel and co-planar with each other and with die pads 404 and 406 and extend from the package 400 on the same edge beyond the periphery of insulated housing 408.

Source electrode 314 of MOSFET die 310 is bonded by bond wires 420 to die pad 404 or to the bond wire post of terminal lead 414, thereby creating a complete half-bridge circuit. Similarly, source electrode 324 of MOSFET die 320 is bonded by bond wires 422 to the bond wire post of terminal lead 410. In addition, gate electrode 326 of MOSFET die 320 and gate electrode 316 of MOSFET die 310 are bonded by bond wires 424 and 426 to the bond wire posts of terminal leads 412 and 416, respectively. Lead frame 402 may be made from copper, and may include a finish to facilitate soldering and bond wiring. Also, the bond wires can be formed from gold; however, aluminum bond wires may also be used. The bond wires may be bonded to the die surface and to the bond posts using thermosonic ball bonding, as is known in the art, though other processes may be used.

After the bond wiring is complete, molded housing 408 is formed using any conventional method. The molded housing 408 may encapsulate MOSFET die 310, MOSFET die 320, and the bond wires, as in the TO-220 package, for example. Alternatively, molded housing 408 may also encapsulate the die pads 404 and 406, as in the FULL PAK type structure, for example. Molded housing 408 may be formed from a polymer based mold compound, such as NITTO MP7400. However, other types of housings, such as a ceramic housing, a hermetic housing or an injection molded metal housing, may be used.

In general, one skilled in the art will recognize that example package 400 according to this example embodiment of the present invention may include more than or fewer than five terminal leads. In addition, the assignment of specific terminal leads to specific gate, source, and drain electrodes, for example, is not particular to the invention and can vary depending on the application. For example, package 400 may include additional terminal leads that can be both isolated from or integral with terminal leads 410–418. Accordingly, each gate, source, and drain electrode of the two MOSFET die may be connected to multiple terminal leads, for example, depending on the specific application.

Figure 6:
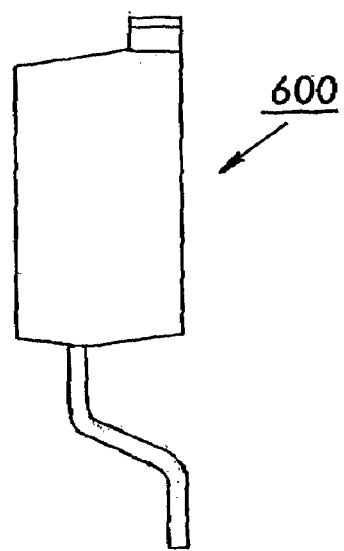
FIG. 6 is schematic right elevational view of an example low profile, prior art, semiconductor device package.

It is further noted that example device package 400 according to this example embodiment of the invention may take the form of a TO-220 low profile package or may take the form of the FULL PAK type structure. The device package may also take the form of the known surface mount TO-263 package (i.e., D2pak), as shown in the right elevational view of example package 600 of FIG. 6. However, similar to the example above, the lead frame of example package 600 now includes two die pads for receiving at least two semi-conductor die, such as MOSFET die 310 and MOSFET die 320.

Figure 7:
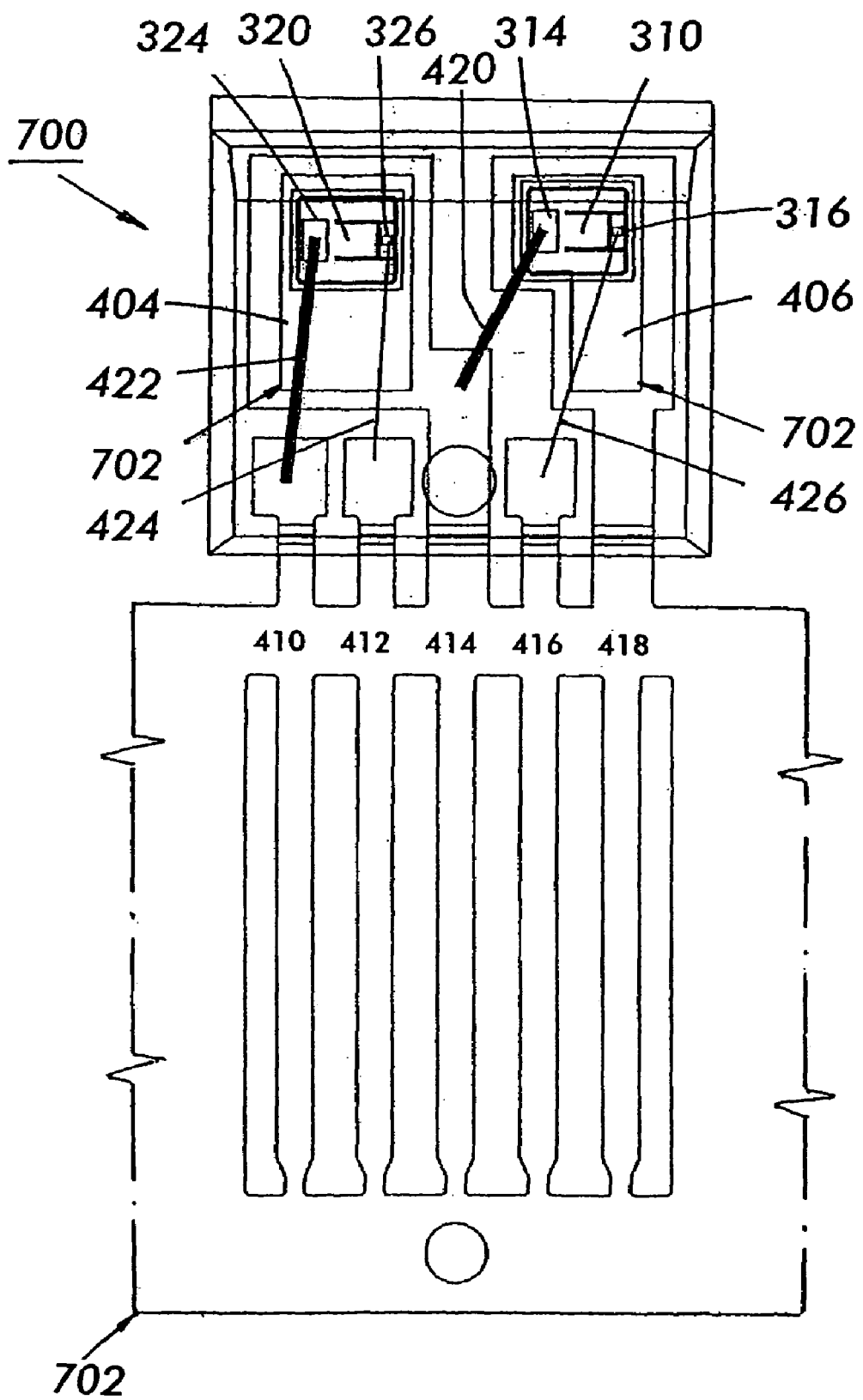
FIG. 7 illustrates an example semiconductor device package according to a further embodiment of the present invention.

Referring now to FIG. 7, an example device package 700 in accordance with a further example embodiment of the present invention is shown. Device package 700 is similar to device package 200 of the prior art and has a lead frame 702 and a number of lead terminals 410–418 that are substantially similar to those of package 200. However, the lead frame according to this embodiment of the invention now includes two distinct die pad 404 and 406 for receiving at least two semiconductor die to form a circuit. Accordingly, example device package 700 is similar to example device package 400 but with the mounting tab 130, as shown in FIG. 5, now removed. Here, example device package 700 includes co-packaged MOSFET die 310 and MOSFET die 320 interconnected to form a half-bridge switching circuit, similar to above. It is noted that example device package 700 according to this further example embodiment of the invention may take the form of a short-height TO-262 package or be a FULL PAK type structure, with the mounting tabs removed.

Figure 8:
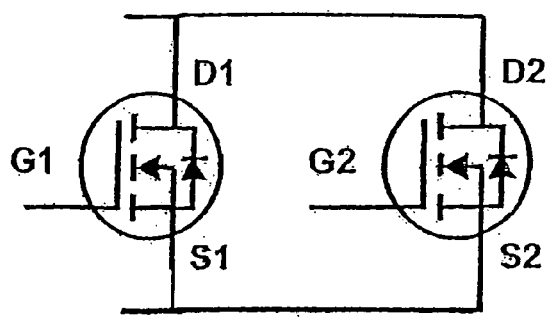
FIGS. 8 and 9 illustrate alternative circuit arrangements for packages according to the present invention that include two power switching devices.
Figure 9:
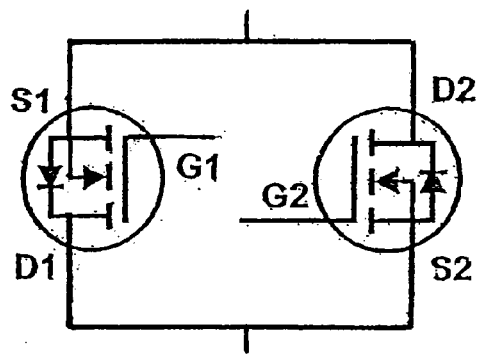

Of course, one skilled in the art will recognize that example device packages 400 and 700 in accordance with the present invention may include different circuit topologies, other than a half-bridge circuit, that use different interconnected combinations of MOSFETs, IGBTs, and diodes. Referring, for example, to FIG. 8, two power MOSFETs, or IGBTs can be co-packaged in a package according to the present invention and then parallel-connected. Also, referring to FIG. 9, two power MOSFETs or IGBTs can be co-package in a package according to the present invention and then connected to form a bidirectional switch. Specifically, for example, if power MOSFETs are used, the drain electrode of one power switch can be connected to the source electrode of the other, and the drain electrode of the other connected to the source electrode of the one power MOSFET to form a bidirectional switch.

Figure 10:
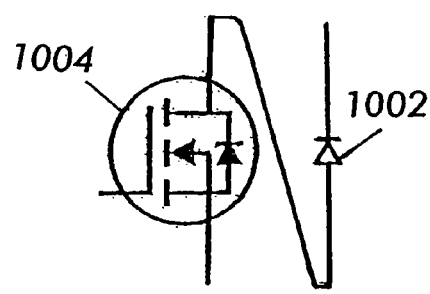
FIGS. 10, 11, and 12 illustrate alternative embodiments in which diverse semiconductor devices are incorporated in packages according to the present invention.
Figure 11:
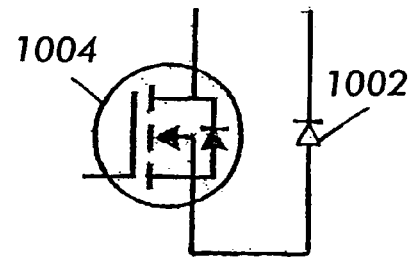
Figure 12:
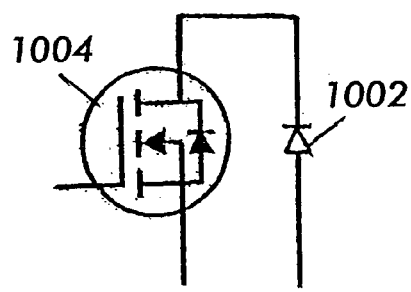
Figure 13:
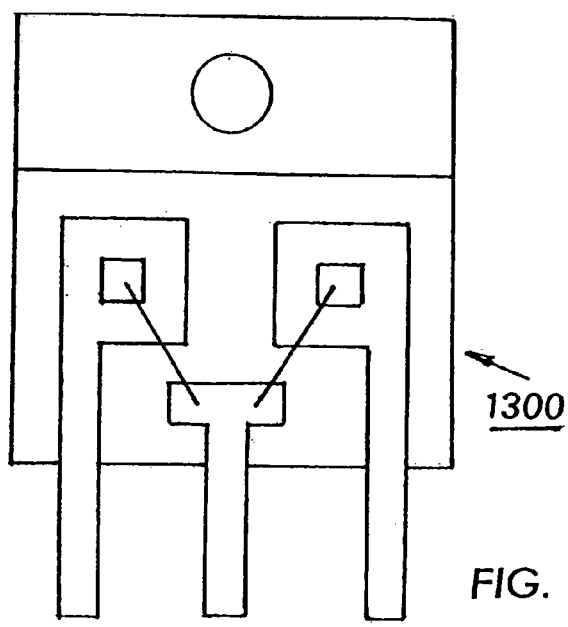
FIG. 13 illustrates an example, prior art, semiconductor device package with a split lead frame with two diodes.

In addition, packages according to the present invention are not limited to having two identical semiconductor devices. Referring to FIGS. 10–12, for example, one of the devices may be a power MOSFET and the other a diode. As seen in FIG. 10, the anode electrode of diode 1002 can be electrically connected to the drain electrode of MOSFET 1004. Such a configuration may be useful in power factor correction circuits. Also, the anode electrode of diode 1002 can be electrically connected to the source electrode of MOSFET 1004. Such a configuration may be used in a buck converter circuit. In addition, the cathode electrode of diode 1002 may be electrically connected to the drain electrode of MOSFET 1004. It should be noted that FIGS. 10–12 only illustrate examples of how a diode 1002 and a MOSFET 1004 contained within packages according to the present invention can be connected and thus adapted for a specific configuration. The present invention, however, is not limited to the specific subject matter shown by FIGS. 10–12.

In general, by co-packaging multiple semiconductor die to form a circuit, such as a half-bridge circuit, within a low profile semiconductor device package, such as package 100, according to the present invention, the benefits of the prior device packages are obtained while also reducing part and assembly costs for end applications, simplifying circuit board layouts, and reducing heat sink dimensions, for example. In addition, by further co-packaging multiple semiconductor die within a low profile, reduced height, semiconductor device package, such as package 200, a wider range of applications can be supported by the present invention over the prior art. Furthermore, by substantially re-using the same lead frame and number of terminal leads as the prior art packages, such as package 100 and package 200, significant changes are not required to manufacture the present invention, thereby preventing increased costs.

Although the present invention has been described in relation to particular embodiments thereof, many other variations and modifications and other uses will become apparent to those skilled in the art. It is preferred, therefore, that the present invention be limited not by the specific disclosure herein.

We claim:

1. A semiconductor device, comprising:
   first and second semiconductor die, each having a drain electrode on one surface and a gate electrode and a source electrode on another opposing surface thereof;
   a lead frame including first and second separate die pad areas, the first semiconductor die being disposed on and electrically coupled to the first die pad area and the second semiconductor die being disposed on and electrically coupled to the second die pad area;
   at least first and second terminal leads, the at least first terminal lead being in permanent electrical connection with the first die pad and the at least second terminal lead being in permanent electrical connection with the second die pad;
   a third plurality of terminal leads being separated from one another, from the at least first and second terminal leads, and from the first and second die pads;
   first bonding wire connecting the gate electrode of the first semiconductor die to at least one of the plurality of terminal leads;
   second bonding wire connecting the gate electrode of the second semiconductor die to at least another one of the plurality of terminal leads; and
   a housing for encapsulating the at least first and second semiconductor die and the bonding wire, and wherein all terminal leads extend beyond a periphery of the housing along a single common edge.

2. The device of claim 1, wherein the device conforms to a TO-263 package standard.

3. The device of claim 1, wherein the first and second die pads are substantially within the periphery of the housing.

4. The device of claim 1, wherein the device conforms to a TO-262 package standard.

5. The device of claim 1, wherein the device conforms to FULL PAK type structure without the mounting tab.

6. The device of claim 1, further comprising:
   third bonding wire arranged to electrically connect one surface of the first semiconductor die to one surface of the second semiconductor die, thereby forming a circuit.

7. The device of claim 6, wherein the first and second die are MOSFET die and the circuit is a half-bridge circuit.

8. The device of claim 1, wherein the first and second die are MOSFET die or IGBTs.

9. The device of claim 8, wherein the first and second die are interconnected to form a circuit.

10. A semiconductor device, comprising:
    at least first and second semiconductor die, each having respective electrodes on opposing surfaces thereof;
    a lead frame including first and second separate die pad areas, the at least first semiconductor die being disposed on and electrically coupled to the first die pad area and the at least second semiconductor die being disposed on and electrically coupled to the second die pad area;
    at least first and second terminal leads, the at least first terminal lead being electrically connected to and extending from one edge of the first die pad and the at least second terminal lead being electrically connected to and extending from one edge of the second die pad;
    a third plurality of terminal leads being separated from one another, from the at least first and second terminal leads, and from the first and second die pads;
    first bonding wire connecting one surface of the first semiconductor die to at least one of the plurality of terminal leads;
    second bonding wire connecting one surface of the second semiconductor die to at least another one of the plurality of terminal leads; and
    a housing for encapsulating the at least first and second semiconductor die and the bonding wire, and wherein all terminal leads are parallel and extend beyond a periphery of the housing along a single common edge; and
    wherein the device conforms to a TO-220 package standard.

11. The device of claim 10, wherein the housing further encapsulates the first and second die pads.

12. A semiconductor device, comprising:
    a first and a second MOSFET die, each having a drain electrode on one surface, and a gate electrode and a source electrode on another opposing surface thereof;
    a lead frame comprising first and second separate die pad areas, the first MOSFET die being disposed on the first die pad such that the drain electrode thereof is electrically coupled to the first die pad, and the second MOSFET die being disposed on the second die pad such that the drain electrode thereof is electrically coupled to the second die pad;
    a first plurality of terminal leads wherein the first die pad and the source electrode of the second MOSFET die are electrically connected to at least a first of said first plurality of terminal leads and wherein the second die pad is electrically connected to at least a second of said first plurality of terminal leads, said at least first and second terminal leads of the first plurality of terminal leads being separated from each other;
    a second plurality of terminal leads being separated from the first plurality of terminal leads and from the first and second die pads wherein the source electrode of the first MOSFET die is electrically connected to at least a first of said second plurality of terminal leads, wherein the gate electrode of the first MOSFET die is electrically connected to at least a second of said second plurality of terminal leads, and wherein the gate electrode of the second MOSFET die is electrically connected to at least a third of said second plurality of terminal leads, said at least first, second, and third terminal leads of the second plurality of terminal leads being separated from one other; and a housing for encapsulating the first and second MOSFET die, and wherein all terminal leads are parallel and extend beyond a periphery of the housing along a single common edge.

13. The device of claim 12, wherein the device conforms to a TO-220 package standard.

14. The device of claim 13 wherein the housing further encapsulates the first and second die pads.

15. The device of claim 12, wherein the device conforms to a TO-263 package standard.

16. The device of claim 12, wherein the first and second die pads are substantially within the periphery of the housing.

17. The device of claim 12, wherein the device conforms to a TO-262 package standard.

18. The device of claim 12, wherein the device conforms to FULL PAK type structure without the mounting tab.

19. A semiconductor device for housing a half bridge circuit, said device comprising:
   a lead frame comprising first and second separate die pad, the first die pad being in permanent electrical connection with at least one terminal lead, and the second die pad being in permanent electrical connection with at least one other terminal lead;
   a plurality of terminal leads being separated from one another, from the first and second die pads, and from the terminal leads in permanent electrical connection with the first and second die pads;
   first and second semiconductor die, each having a drain electrode on one surface and a gate electrode and a source electrode on another opposing surface thereof, wherein the first semiconductor die is disposed on and electrically coupled to the first die pad and the second semiconductor die is disposed on and electrically coupled to the second die pad;
   first bonding wire connecting one surface of the second semiconductor die to the first die pad such that the first and second semiconductor die form a half bridge circuit;
   second bonding wire connecting the gate electrode of the second semiconductor die to at least a first of the plurality of terminal leads;
   third bonding wire connecting the gate electrode of the first semiconductor die to at least a second of the plurality of terminal leads; and
   a housing for encapsulating the first and second semiconductor die and the bonding wire, and wherein all terminal leads extend beyond a periphery of the housing along a single common edge.

20. The device of claim 19, wherein the device conforms to a TO-263 package standard.

21. The device of claim 19, wherein the first and second die pads are substantially within the periphery of the housing.

22. The device of claim 19, wherein the device conforms to a TO-262 package standard.

23. The device of claim 19, wherein the device conforms to FULL PAK type structure without the mounting tab.

24. A semiconductor device for housing a half bridge circuit, said device comprising:
   a lead frame comprising first and second separate die pad, the first die pad being electrically connected to at least one terminal lead, and the second die pad being electrically connected to at least one other terminal lead;
   a plurality of terminal leads being separated from one another, from the first and second die pads, and from the terminal leads electrically connected to the first and second die pads;
   first and second semiconductor die, each having on opposing surfaces thereof respective electrodes, wherein the first semiconductor die is disposed on and electrically coupled to the first die pad and the second semiconductor die is disposed on and electrically coupled to the second die pad;
   first bonding wire connecting one surface of the second semiconductor die to the first die pad such that the first and second semiconductor die form a half bridge circuit;
   second bonding wire connecting one surface of the second semiconductor die to at least a first of the plurality of terminal leads;
   third bonding wire connecting one surface of the first semiconductor die to at least a second and a third of the plurality of terminal leads; and
   a housing for encapsulating the first and second semiconductor die and the bonding wire;
   wherein the at least first and second terminal leads are intended for controlling the half bridge circuit, and wherein the at least third terminal lead, together with the at least one terminal lead electrically connected to the second die pad, are intended for interfacing the half bridge circuit; and
   wherein the device conforms to a TO-220 package standard.

25. The device of claim 24, wherein the housing further encapsulates the first and second die pads.

* * * * *